(12) United States Patent
Anazawa et al.

(10) Patent No.: US 7,087,921 B2
(45) Date of Patent: Aug. 8, 2006

(54) ACTIVE ELECTRONIC DEVICE AND ELECTRONIC APPARATUS

(75) Inventors: Kazunori Anazawa, Nakai-machi (JP); Chikara Manabe, Nakai-machi (JP); Hiroyuki Watanabe, Nakai-machi (JP); Hirotsugu Kashimura, Nakai-machi (JP); Masaaki Shimizu, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 10/724,192

(22) Filed: Dec. 1, 2003

(65) Prior Publication Data

US 2004/0119127 A1 Jun. 24, 2004

(30) Foreign Application Priority Data

Dec. 9, 2002 (JP) ............................. 2002-356610

(51) Int. Cl.
*H01L 47/02* (2006.01)
(52) U.S. Cl. ...................... 257/8; 257/24; 257/E51.04; 257/E47.003
(58) Field of Classification Search .................. 257/20, 257/22, 27, 24, 8, E47.003, E51.04
See application file for complete search history.

(56) References Cited

U.S. PATENT DOCUMENTS

2002/0024099 A1 * 2/2002 Watanabe et al. ........... 257/368

2003/0098488 A1 * 5/2003 O'Keeffe et al. ........... 257/401

OTHER PUBLICATIONS

S. J. Tans et al., "Room-temperature transistor based on a single carbon nanotube", Nature, vol. 393, pp. 49-51, 1998.
A. Javey et al., "Carbon Nanotube Transistor Arrays for Multistage Complementary Logic and Ring Oscillators", Nano Letters, vol. 2, pp. 929-939, 2002.
P.G. Collins et al., "Engineering Carbon Nanotubes and Nanotube Circuits Using Electrical Breakdown", vol. 292, pp. 706-709.

* cited by examiner

*Primary Examiner*—Jerome Jackson
(74) *Attorney, Agent, or Firm*—Oliff & Berridge, PLC (57) ABSTRACT

To provide an active electronic device which is formed from a carbon nanotube and which excels in high frequency operation and an electronic apparatus using the active electronic device. Provided are the active electronic device including: a carbon nanotube (1); a first electrode (S) connected to one end of the carbon nanotube; a second electrode (D) connected to the other end of the carbon nanotube; and a third electrode (G) facing the carbon nanotube (1) to irradiate the carbon nanotube (1) with electromagnetic waves, in which the amount of current flowing into the carbon nanotube (1) is changed by electromagnetic waves, at least high frequency electromagnetic waves, radiated from the third electrode onto the carbon nanotube (1), and the electronic apparatus using the active electronic device.

2 Claims, 6 Drawing Sheets

REFLECTION COEFFICIENT

ACTIVE ELECTRONIC DEVICE AND ELECTRONIC APPARATUS

BACKGROUND OF THE INVENTION

1. Field of the Invention

The present invention relates to a novel active electronic component which can operate at high speed and an electronic apparatus using the component.

2. Description of the Related Art

It is not easy to downsize silicon-made field effect transistors (Si transistors), which are currently used in communication circuits, logic circuits and the like, to the theoretically-predicted limit. There are a lot of problems in reducing in size an Si transistor for the purpose of enhancing the performance and improving the degree of integration.

For instance, when the Si transistor size is 100 nm or smaller, higher exposure and etching techniques are required, and in addition to these difficulties met in the manufacture process, such Si transistor has operational problems in short channel effect and temperature rise of the device. In the case of a logic device, the conduction effect below the threshold, output conductance, and device power gain are reduced. In the case of a volatile memory such as a dynamic random access memory and a non-volatile memory device such as an electrically-erasable programmable random access memory device, conduction below the threshold brings leakage of accumulated electric charges and lowering of the threshold performance.

On the other hand, transistors formed from new materials such as GaAs are difficult to process and can hardly build large-scale integrated circuits aside from some logic circuits and communication devices.

Recently, carbon nanotubes are attracting attention as new semiconductor materials. This is because carbon nanotubes are about 10 nm in diameter and have a conduction mechanism resembling ballistic conduction, which enables a carbon nanotube device to operate at high speed and causes the device to generate less heat.

Using single wall carbon nanotubes that exhibit the semiconductor characteristic, rectifiers and transistors have heretofore been manufactured by way of trial. An advantage of using a carbon nanotube as an electronic device resides in that the conduction mechanism of carbon nanotubes, namely, ballistic conduction, hardly allows electrons to scatter within a solid substance. In other words, transistors constructed from carbon nanotubes are advantageous in high speed operation and less heat generation of carbon nanotubes.

In addition, carbon nanotubes are suitable as a device and electrode of a minute circuit because general carbon nanotubes are about 1 to 20 nm in diameter. The technique of manufacturing devices using carbon nanotubes is making an advance, and available now are such techniques as separating single wall carbon nanotubes that exhibit the semiconductor characteristic from the carbon nanotubes that doesn't exhibit the semiconductor characteristic and doping a carbon nanotube with an impurity.

Several techniques related to devices that use carbon nanotubes have been disclosed. Examples of those techniques include one for building a field effect transistor that operates at room temperature by connecting to a platinum electrode a single wall carbon nanotube that exhibits the semiconductor characteristic (see S. J. Tans, et al., Nature, vol. 33, 1998, pp. 49–51, "Room-temperature transistor based on a single carbon nanotube"), and one for manufacturing a p-channel carbon nanotube transistor and an n-channel carbon nanotube transistor to build a complementary type inverter from the p-channel and n-channel transistors (see A. Javey et al., Nano Letters, vol. 2, 2002, pp. 929–932, "Carbon Nanotubes Transistor Arrays for Multistage Complementary Logic and Ring Oscilators").

However, according to operation examples that have been reported so far, the oscillation frequency of a carbon nanotube transistor evaluated by a ring oscillator is about 200 Hz, meaning the operation speed is very slow. High storage capacitor of wiring is suspected as the cause of the slow operation speed. On the other hand, it is considered that ballistic conduction of the carbon nanotube hinders the carbon nanotube transistor from performing normal transistor operation.

Of carbon nanotubes, only single wall carbon nanotubes exhibit the semiconductor characteristic. Furthermore, not all of single wall carbon nanotubes exhibit the semiconductor characteristic and the rest show metallic properties. Multilayer carbon nanotubes show metallic properties while none of them exhibit the semiconductor characteristic. Only carbon nanotubes with the semiconductor characteristic can constitute normal active electronic devices that utilize field effect. Although there has been proposed a method in which each carbon nanotube receives a large amount of current to eliminate carbon nanotubes that exhibit metallic properties, thus leaving those with the semiconductor characteristic (see P. G. Collins, et al., Science, vol. 292, 706–709, "Engineering Carbon Nanotubes and Nanotube Circuits Using Electrical Breakdown"), the method requires troublesome manipulation and is not suitable for mass production.

SUMMARY OF THE INVENTION

Therefore, the industries are waiting for a device technique that enables a device formed from a carbon nanotube with metallic properties to operate actively and at high speed.

The present invention has been made in view of the above circumstances, and provides an active electronic device which is formed from a carbon nanotube and which excels in high frequency operation and an electronic apparatus using the active electronic device.

According to an aspect of the present invention, an active electronic device includes:

a carbon nanotube;

a first electrode connected to one end of the carbon nanotube;

a second electrode connected to the other end of the carbon nanotube; and a third electrode facing the carbon nanotube to irradiate the carbon nanotube with electromagnetic waves, and is characterized in that the amount of current flowing into the carbon nanotube is changed by electromagnetic waves, at least high frequency electromagnetic waves, radiated from the third electrode onto the carbon nanotube.

The present inventors have thought of the present invention based on a finding that the conductivity of a carbon nanotube can be changed by setting electrodes as described above in relation to the carbon nanotube and radiating high frequency wave from the third electrode onto the carbon nanotube. A change in conductivity of the carbon nanotube causes a change in amount of current flowing into the carbon nanotube and also changes the resistance between the first electrode and the second electrode.

The basic structure of the active electronic device of the present invention is similar to the structure of a field effect transistor that uses a carbon nanotube. However, the present invention is innovative in that high frequency waves are radiated from the third electrode, which corresponds to a gate electrode of a transistor, to make it possible to control the conductivity of the carbon nanotube even if it is a multi wall carbon nanotube or other carbon nanotube with metallic properties, thus obtaining an active electronic device from other carbon nanotube than a single wall carbon nanotube with the semiconductor characteristic.

In short, the present invention expands the range of carbon nanotubes as device materials, which has hitherto been limited to single wall carbon nanotubes that exhibit the semiconductor characteristic, to encompass all carbon naotubes including multi wall carbon nanotubes and signal-layer carbon nanotubes having metallic properties. The present invention thus makes a great contribution to facilitation and cost reduction in manufacture of a carbon nanotube device.

Arranging three electrodes and a carbon nanotube in relation to one another as described above constitutes the basic structure of the active electronic device of the present invention. In an actual device structure, for example, the first electrode and the second electrode are formed on the front surface of a substrate, and the third electrode is formed on the front or rear surface of the substrate.

The active electronic device of the present invention can change the amount of current flowing into the carbon nanotube by using, for example, high frequency electromagnetic waves radiated from the third electrode to make the amount of current flowing into the carbon nanotube larger than the case when the carbon naotube is not irradiated with any electromagnetic wave.

The carbon nanotube in the present invention can be any type of carbon nanotube and maybe a multi wall carbon nanotube as described above. The length of the carbon nanotube varies depending on circumstances. To give an example, the carbon nanotube is equal to or more than 1 nm and equal to or less than 100 μm in length.

Materials of the first, second, and third electrodes are not particularly limited. Preferably, one is selected from the group consisting of Au, Pt, Ag, and Si for the first electrode, the second electrode, and the third electrode, separately.

In building the active electronic device of the present invention on the front or rear surface of a substrate, it is common for the substrate to have a specific inductive capacity of 1 or more and 100 or less. The material of the substrate is not particularly limited. Preferably, the substrate is an insulator that contains one selected from the group consisting of silicon oxide, titanium oxide, aluminum oxide, and silicon nitride.

An electronic apparatus of the present invention is characterized by having an active electronic device (that is, the active electronic device of the present invention) and a driver circuit, the active electronic device including: a carbon nanotube; a first electrode connected to one end of the carbon nanotube; a second electrode connected to the other end of the carbon nanotube; and a third electrode placed near the carbon nanotube to irradiate the carbon nanotube with electromagnetic waves, the driver circuit causing the third electrode to output electromagnetic waves, at least, high frequency electromagnetic waves.

DESCRIPTION OF THE PREFERRED EMBODIMENTS

A specific description of the present invention will be given below through an embodiment mode.

Figure 1:
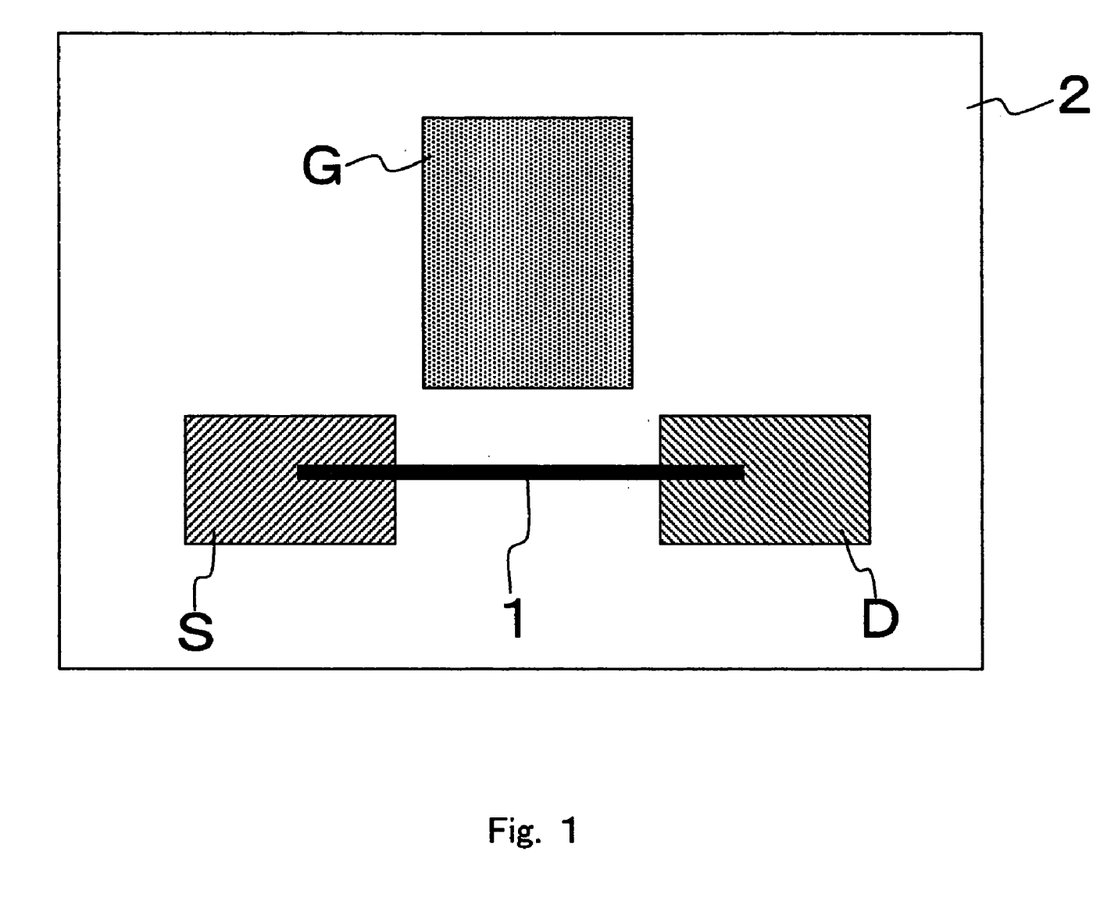
FIG. 1 is a schematic plan view showing an embodiment mode of an active electronic device of the present invention.

FIG. 1 is a schematic plan view showing an embodiment mode of an active electronic device of the present invention. The active electronic device of this embodiment mode is composed of a source electrode (first electrode) S, a drain electrode (second electrode) D, a carbon nanotube 1, and a gate electrode (third electrode) G. The source electrode S is formed on the front surface of a substrate 2. The carbon nanotube 1 is positioned to bridge the gap between the source electrode S and the drain electrode D. The gate electrode G is formed near the carbon nanotube 1 on the front surface of the substrate 2.

In the description, the electrodes of the active electronic device of the present invention are respectively referred to as source, drain and gate, which are transistor terms. This is because the active electronic device of the present invention has a structure resembling to that of a field effect transistor and has a similar function in that an external effect causes a change in current characteristic between two electrodes, although the active electronic device of the present invention does not function as a transistor. The first electrode and the second electrode are equally ranked, and therefore either can be a source while the other serves as a drain. However, in the description of the present invention, the first electrode is called a source electrode and the second electrode is called a drain electrode.

Having the basic structure as the one described above, the active electronic device of this embodiment mode has the gate electrode G that emits a high frequency wave that is in a given frequency band and in a given intensity range. This causes a change in conductivity of the carbon nanotube 1 and also changes the resistance between the source electrode S and the drain electrode D. Accordingly, the voltage-current characteristic is also changed when a voltage is applied between the source electrode S and the drain electrode D. In short, the active electronic device of this embodiment mode can actively control the current characteristic between the source electrode S and the drain electrode D by the frequency of an electromagnetic wave radiated from the gate electrode G.

The principle of the active electronic device of the present invention itself is not clear but is surmised to be correlated with the high frequency wave transmission characteristic of the carbon nanotube. The high frequency wave transmission characteristic will be described below taking a multi wall carbon nanotube as an example.

An Au electrode is connected to each end of a multi wall carbon nanotube to measure the reflection coefficient and the transmission coefficient using a measurement system that is constituted of a vector network analyzer (8753ES, a product of Agilent Technologies) and a coaxial airline. After a modification is made to set the magnetic permeability of free space and the dielectric constant to 1, a sample is inserted into the coaxial airline, and the two parameters, the reflection coefficient (S11) and the transmission coefficient (S21), are measured using two ports of the vector network analyzer.

Figure 2:
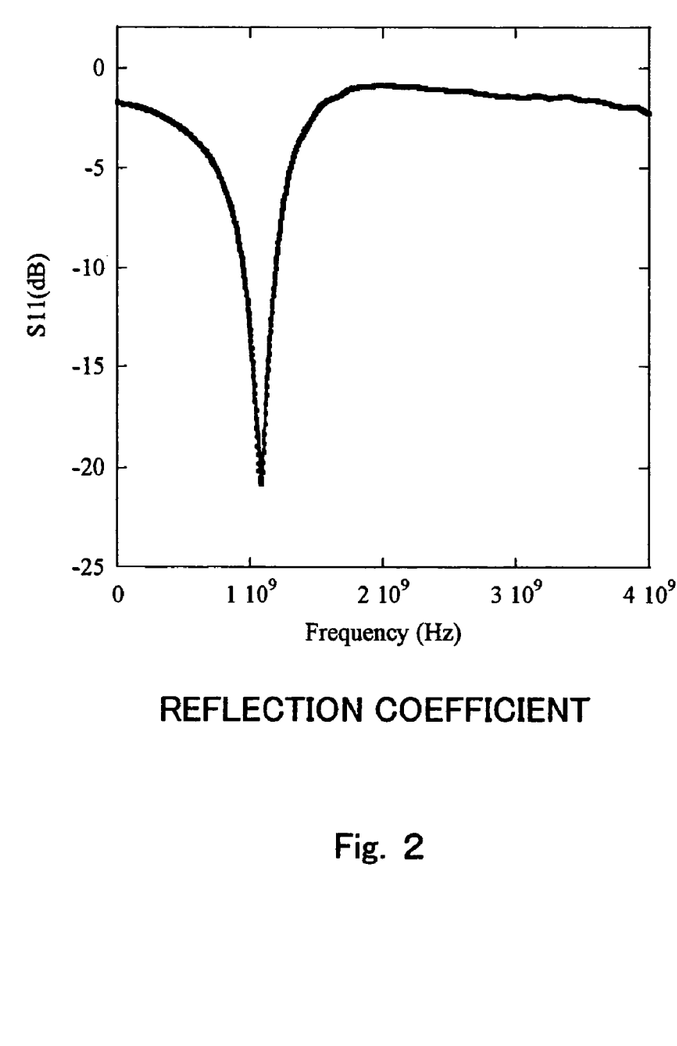
FIG. 2 is a graph obtained by plotting measurement data of reflection coefficient of a multi wall carbon nanotube with an axis of abscissa representing an electromagnetic wave frequency.

As a result, it has been found that the reflection coefficient (S11) experiences a great loss around 1 GHz whereas the transmission coefficient (S21) experiences a rise in transmittance around 1 GHz. Of the reflection coefficient (Sl1) data measured, ones that have been observed to have significance are plotted into a graph with the axis of abscissa representing the electromagnetic wave frequency. The graph is shown in FIG. 2. The results indicate that the multi wall carbon nanotube that has been subjected to measurement tends to transmit only electromagnetic waves of about 1 GHz. It is inferred that the mode of vibration in the multi wall carbon nanotube and the electromagnetic waves of around 1 GHz resonate with each other to improve the transmission characteristic.

Carbon nanotubes are composed of graphene sheets and therefore are a substance having an electron structure close to a perfect blackbody, which absorbs electromagnetic waves of various wavelengths. Accordingly, when irradiated with a high frequency wave of around 1 GHz from the external, the multi wall carbon nanotube absorbs the electromagnetic wave, converts the electromagnetic wave into a carrier within the multi wall carbon nanotube, and transmits the carrier that vibrates at 1 GHz. It is therefore presumed that the electromagnetic wave radiation increases the density of free carriers in the multi wall carbon nanotube and improves the conductivity.

Note that the above principle is a deduction drawn from the high frequency transmission characteristic of carbon nanotubes and that effects of the present invention are not to be limited by the functions based on the above principle.

Described next taking the structure of this embodiment as an example is a specific structure of the active electronic device of the present invention.

For the substrate 2, an appropriate one can be chosen from known substrates. The specific inductive capacity of the substrate 2 is commonly equal to or more than 1 and equal to or less than 100. The material of the substrate 2 is not particularly limited. Preferably, the substrate 2 is an insulator that contains one selected from the group consisting of silicon oxide, titanium oxide, aluminum oxide, and silicon nitride.

Materials of the electrodes are not particularly limited. Preferably, one is selected from the group consisting of Au, Pt, Ag, and Si for the source electrode S, the drain electrode D and the gate electrode G, separately. Usual semiconductor processes are employed to form these electrodes. Specifically, the electrodes are formed by sputtering, vacuum evaporation, and the like. The electrodes can be as thick as wires and electrodes in a usual semiconductor device, but generally a thickness in an order between about 50 nm and 2 µm is chosen for each of the electrodes.

The premise in arranging the source, drain and gate electrodes is that the electrodes are electrically isolated (spaced apart) from one another. The carbon nanotube 1 bridges the gap between the source electrode S and the drain electrode D, and therefore, the gap between the source electrode S and the drain electrode D in this embodiment mode is inevitably shorter than the length of the carbon nanotube 1. Specifically, the gap is set to an extent of from about 10 nm to 10 µm, preferably about 1 to 5 µm. However, in the present invention, the gap between the source electrode and the drain electrode can be set larger if the gap is bridged by plural carbon nanotubes that are in contact with one another.

The gate electrode G is preferably set close to the carbon nanotube 1 to a certain degree. On the other hand, placing the gate electrode too close to the other two electrodes may present manufacturing difficulties. For that reason, the tip of the gate electrode G may be provided with a dielectric layer for guiding a high frequency wave that is radiated from the gate electrode G to the carbon nanotube 1. The dielectric layer can be positioned in the vicinity of the carbon nanotube 1 or can be extended below the carbon nanotube 1 to come into contact with the carbon nanotube 1. The dielectric layer is formed of $TiO_2$, for example.

The position of the gate electrode G is determined not by the relation to the other two electrodes but rather by the distance from the carbon nanotube 1. The gate electrode G has to face the carbon nanotube 1 across a distance short enough for the gate electrode to irradiate the carbon nanotube 1 with electromagnetic waves effectively. The distance between the gate electrode G and the carbon nanotube 1 varies depending on the intensity of the electromagnetic wave radiated. However, taking into account the responsiveness of the carbon nanotube to the electromagnetic wave, it is preferable to place the gate electrode G and the carbon nanotube 1 close to each other to a certain degree. Specifically, the distance between the carbon nanotube 1 and the gate electrode G is in an order about equal to or more than 10 nm and equal to or less than 5 µm.

The gate electrode G in this embodiment mode is formed on the same surface as the other two electrodes, namely, the front surface of the substrate 2. However, no inconveniences are presented by forming the gate electrode G on the rear surface of the substrate 2 as long as the position of the gate electrode G is determined based on the relation to the carbon nanotube 1 in the manner described above. Alternatively, the gate electrode G may be formed independently from the substrate 2 such that the tip of the gate electrode having a needle like shape is brought into contact with the carbon nanotube 1.

Any carbon nanotube, multi wall or single wall, can serve as the carbon nanotube 1. An active electronic device of the present invention is characterized by being capable of using with good results a carbon nanotube that does not show the semiconductor characteristic, and it is a large merit that a single wall carbon nanotube and a multi wall carbon nanotube that have metallic properties can be used as a material of an active device.

A common nanotube manufactured by, for example, arc discharge or chemical vapor growth can be used as the carbon nanotube 1 without a problem. The diameter and length of the carbon nanotube 1 are not particularly limited.

For example, the carbon nanotube 1 has a diameter of 1 nm or more and 0.1 µm or less and a length of 1 nm or more and 1 mm or less.

The carbon nanotube 1 bridges the gap between the source electrode S and the drain electrode D. When only one carbon nanotube is used, the carbon nanotube is placed such that its ends are in contact with the source electrode S and the drain electrode D, respectively, as in this embodiment mode, and fixed if necessary. When plural carbon nanotubes are used, the carbon nanotubes are brought into contact with one another to bridge the gap between the source electrode S and the drain electrode D. This case also conforms to the concept of the present invention, i.e., "the carbon nanotubes are connected to the source electrode at one end and to the drain electrode at the other end."

When plural carbon nanotubes are used, one or more than one carbon nanotubes can be in contact with the source electrode S and/or the drain electrode D. It is sufficient if the gap between the source electrode S and the drain electrode D is bridged by at least one carbon nanotube in total.

To bridge the gap between the source electrode S and the drain electrode D with the carbon nanotube 1, a micromanipulator is used to manipulate one or more carbon nanotubes, for example. Any method can be employed as long as carbon nanotube bridging described above is achieved ultimately.

Electric conduction has to be ensured in connecting the carbon nanotube 1 to the source electrode S and the drain electrode D. For example, one way to connect the carbon nanotube 1 to the electrodes is to irradiate the junction between an end of the carbon nanotube 1 and the source electrode S and the junction between the other end of the carbon nanotube 1 and the drain electrode D with electron beams. This method can enhance the electrical mechanical connection between the carbon nanotube 1 and the electrodes. The present invention is not limited to this method, and various known methods can be employed to connect the carbon nanotube 1 to the source and drain electrodes. If strong fixing is not particularly desired, the carbon nanotube 1 may simply be placed on the source electrode S and the drain electrode D.

Figure 3:
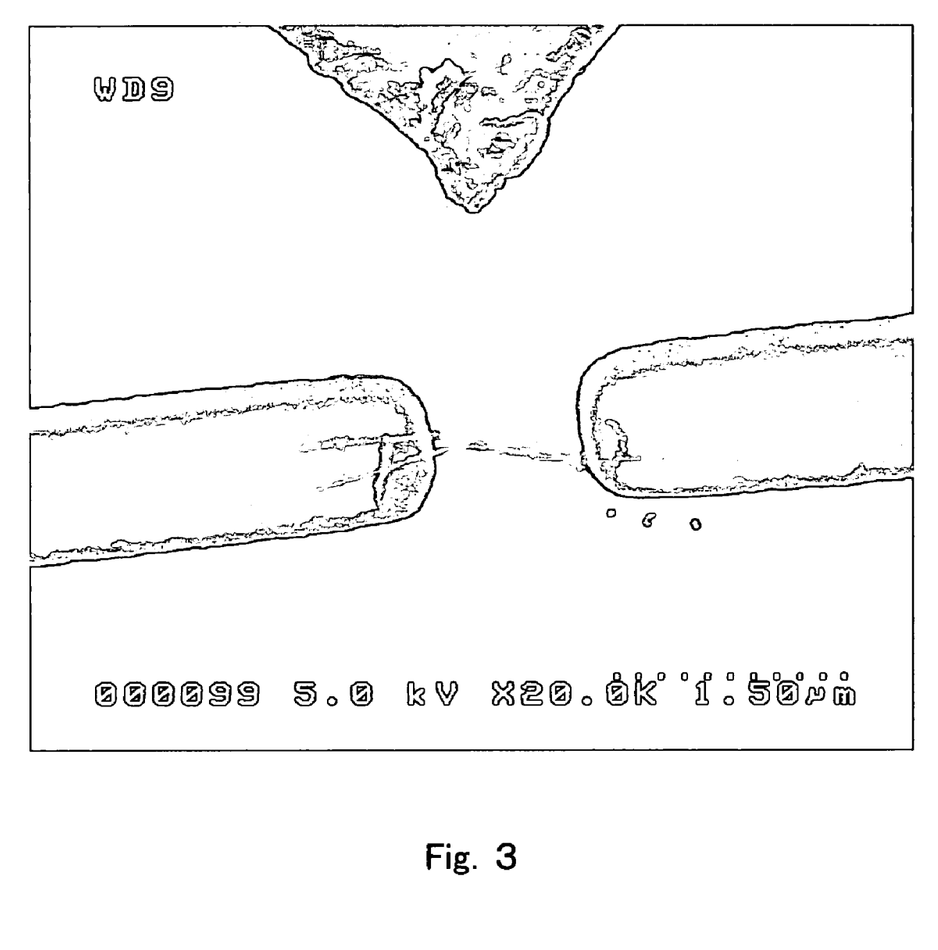
FIG. 3 is a scanning electron microscope picture (×20000) showing an example of the active electronic device of the present invention.

The active electronic device of the present invention is manufactured as above (one manufactured in an embodiment described later), and a scanning electron microscope picture (×20000) of the device is shown in FIG. 3. There is some degree of error in magnification of the picture which is resulted from enlarging the picture. In FIG. 3, the active electronic device of the present invention has a source electrode and a drain electrode formed on the left hand side and right hand side of the picture, respectively, and a carbon nanotube bridges the gap between the electrodes. A gate electrode is placed above the carbon nanotube.

When the gate electrode G emits a high frequency wave toward the carbon nanotube 1, the conductivity of the carbon nanotube is improved by the influence of the high frequency wave. The change in conductivity improves the electric resistance between the source electrode and the drain electrode. Accordingly, the active electronic device of the present invention acts as an active device in a high frequency circuit.

Structured as above, the active electronic device of the present invention has a characteristic of changing conductivity in response to a specific high frequency wave. Utilizing this characteristic, the present invention can be applied to various electronic devices. Specifically, the present invention can be employed in an electronic device that functions as an electronic device for detecting a high frequency wave of specific frequency and an electronic device that functions as a switching device for ON-OFF control by a high frequency wave of specific frequency.

An electronic apparatus of the present invention is characterized by having an active electronic device (the above-described active electronic device of the present invention) and a driver circuit, the active electronic device including: a carbon nanotube; a first electrode connected to one end of the carbon nanotube; a second electrode connected to the other end of the carbon nanotube; and a third electrode placed near the carbon nanotube to irradiate the carbon nanotube with electromagnetic waves, the driver circuit causing the third electrode to output electromagnetic waves, at least, high frequency electromagnetic waves. There is no particular limitation put on the driver circuit as long as the driver circuit can cause the third electrode to output a high frequency electromagnetic wave, and various known units can be incorporated in the driver circuit. A specific example thereof is an analog RF signal generator, which is used for a measurement system in an embodiment described later.

[Embodiment]

A more specific description will be given below on the present invention through embodiments, but the present invention is not limited by the following embodiments.

(Embodiment 1)

A substrate is prepared by growing a silicon oxide film by thermal oxidization to a thickness of 1 µm on the front surface of a 6 mm×6 mm N-type Si (100) wafer with a thickness of 0.4 mm.

Next, patterns for source, drain, and gate electrodes are formed on the front surface of the substrate by lift-off. Specifically, photo resist is processed first by light exposure, and then Ti and Au are deposited on the resist by electron beam evaporation. The Ti layer is 500 nm in thickness, and the Au layer has a thickness of 800 nm. The source electrode and the drain electrode face each other, and the gap between the two is set to 1 µm. The gate electrode is positioned 1.5 µm away from the central axis of the source and drain electrodes in the vertical direction. The resist is peeled. After that, the substrate is subjected to precision cleaning, and chips of the electrodes formed are cut out.

Ends of a multi wall carbon nanotube, which is manufactured by arc discharge to have a diameter of 30 nm and a length of 2 µm, are placed and connected in a manner that bridges the gap between the source electrode and the drain electrode. Specifically, one carbon nanotube is manipulated by a micromanipulator and moved to a desired position. The carbon nanotube is then fixed to the source and drain electrodes (Au/Ti electrodes) by electron beams, thus completing manufacture of an active electronic device of this embodiment. A scanning electron microscope picture of the obtained active electronic device is shown in FIG. 3.

Figure 4:
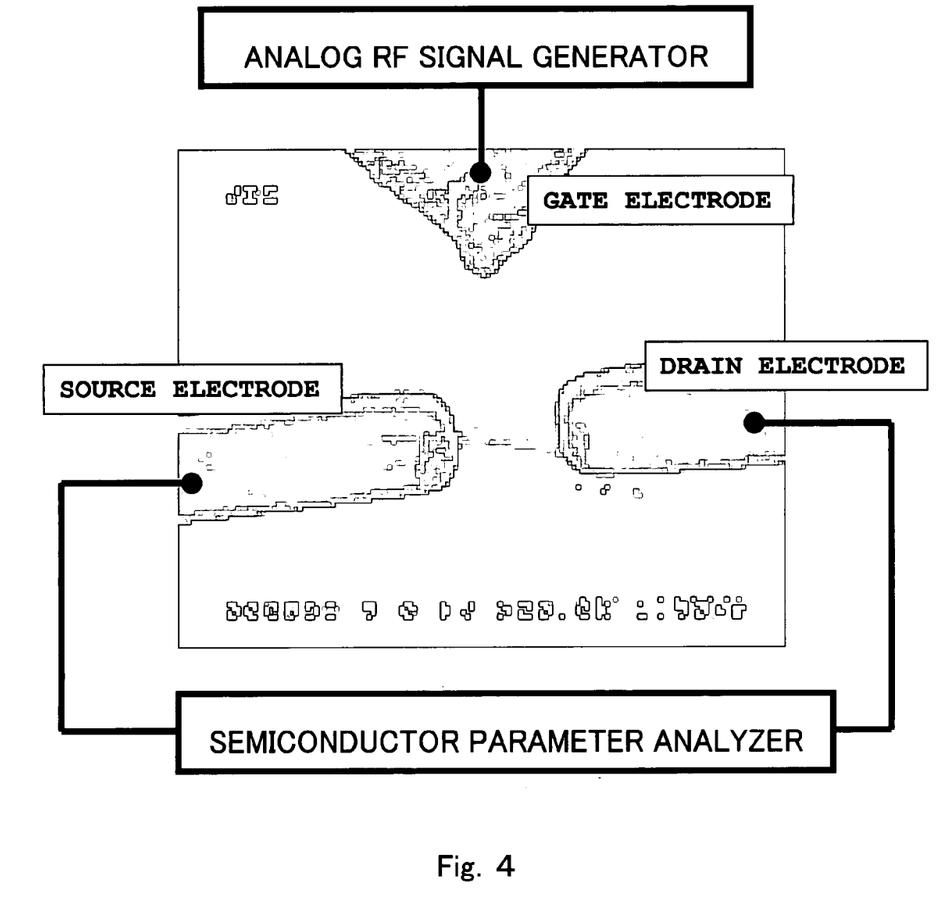
FIG. 4 is a circuit diagram drawn directly over the scanning electron microscope picture of FIG. 3 to show an example of an electronic apparatus of the present invention, the apparatus being wired to incorporate a measuring system for measuring an electric characteristic of the active electronic device.

A measurement system shown in FIG. 4 is constructed in order to measure an electric characteristic of the obtained active electronic device. FIG. 4 is a circuit diagram showing how the measurement system is wired to the active electronic device of this embodiment in order to measure an electric characteristic of the device. The circuit diagram of FIG. 4 is directly written over FIG. 3, which is a scanning electron microscope picture of the active electronic device of this embodiment. The apparatus illustrated in this circuit diagram itself operates as an electronic apparatus of the present invention. Used as a semiconductor parameter analyzer in the circuit diagram of FIG. 4 is HP4156B, a product of Agilent Technologies, and an analog RF signal generator of the measurement system is another product of Agilent Technologies, E4422B.

With this measuring system, a current flowing between the source electrode and the drain electrode is measured by sweeping (scanning) a voltage applied between the source electrode and the drain electrode while a high frequency (RF) signal (frequency: 1 MHz to 4 GHz, intensity: 20 dBm) is inputted to the gate electrode. Also measured are a source-drain current of when no RF signal is inputted to the gate electrode and a source-drain current of when the inputted RF signal has a frequency of 1 GHz and an intensity of 0 dBm.

Figure 5:
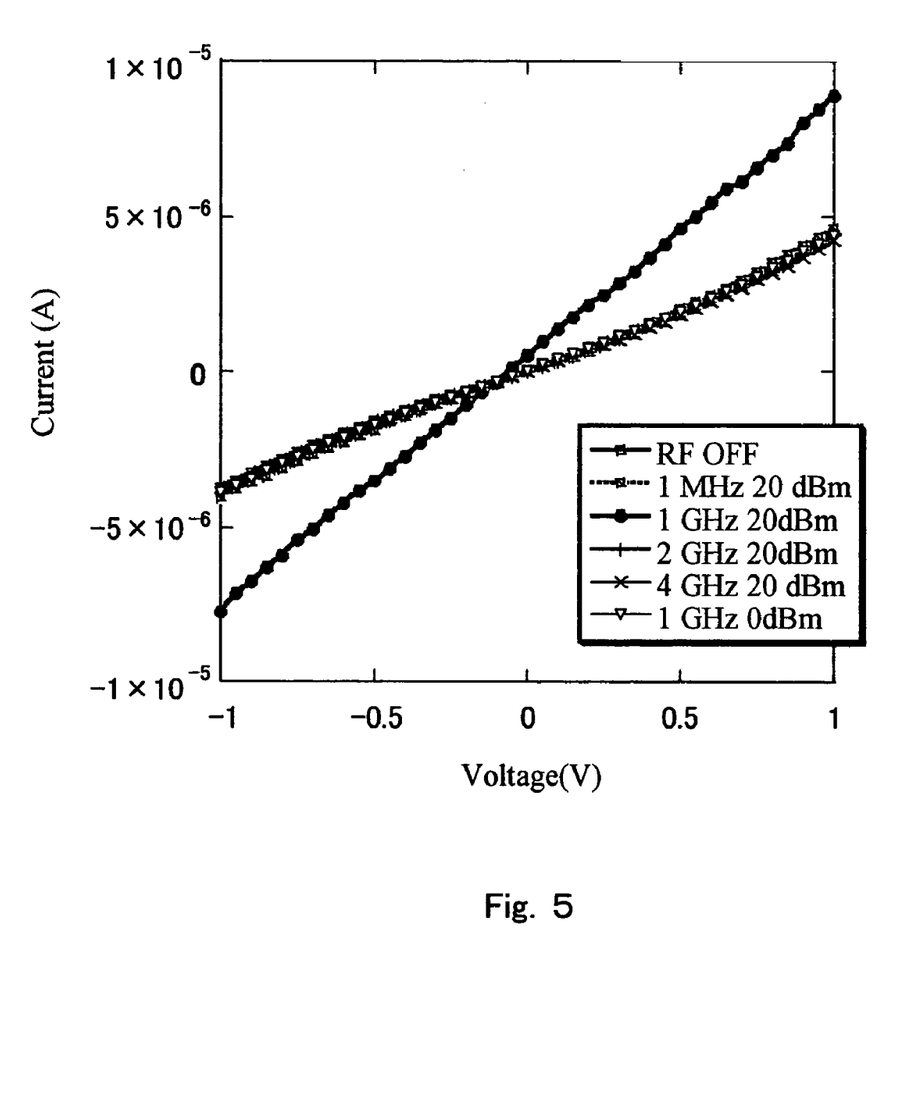
FIG. 5 is a graph showing changes in current flowing between a source electrode and a drain electrode in an example of the active electronic device of the present invention when a voltage applied between the source electrode and the drain electrode is swept while a high frequency signal is inputted to a gate electrode.

The measurement results are shown in a graph of FIG. 5. The graph indicates that, only when an RF signal of 1 GHz and 20 dBm is inputted, there is a characteristic flow of current twice larger than in other cases where the current value is no different from when the gate electrode does not receive an RF signal.

(Embodiment 2)

Figure 6:
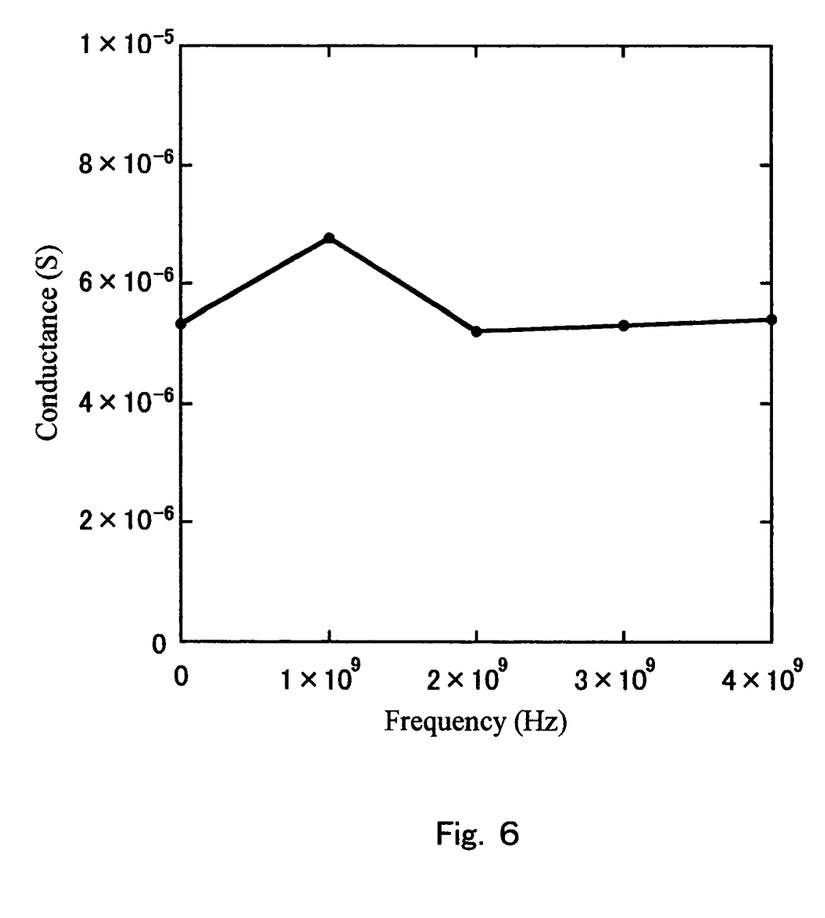
FIG. 6 is a graph obtained by measuring a frequency dependency of conductivity in an example of the active electronic device of the present invention with an axis of abscissa representing a frequency of an electromagnetic wave (RF signal) radiated from the gate electrode and an axis of ordinate representing the conductivity between a source electrode and a drain electrode.

An active electronic device and a measurement system (electronic apparatus) are manufactured in a manner similar to Embodiment 1. The frequency dependency of the conductivity is measured by the semiconductor parameter analyzer and the analog RF signal generator of the measurement system. The results are shown in FIG. 6. The axis of abscissa of FIG. 6 indicates the frequency of an electromagnetic wave (RF signal) emitted from the gate electrode. The axis of ordinate of FIG. 6 indicates the conductivity between the source electrode and the drain electrode which is measured while inputting an RF signal of 20 dBm at various frequencies. The results show that the active electronic device of this embodiment has an ability of detecting a high frequency wave of about 1 GHz and can function as a device for detecting a high frequency wave of specific frequency.

There is a correlation between the conductivity profile in the graph of FIG. 6 and the reflection coefficient (S11) profile of FIG. 2 that has already been described. It is inferred from the correlation that the reflection coefficient (and transmission coefficient) of the carbon nanotube is changed at a specific frequency and that the change is followed by a response of the active electronic device of this embodiment, which is a three-terminal carbon nanotube device, to a high frequency wave of specific frequency.

As described above, according to the present invention, there is provided an active electronic device which is formed from a carbon nanotube and which excels in high frequency operation. The active electronic device of the present invention is innovative in that high frequency waves are radiated from the third electrode to make it possible to control the conductivity of the carbon nanotube even if it is a multi wall carbon nanotube or other carbon nanotube with metallic properties, thus obtaining an active electronic device from other carbon nanotube than a single wall carbon nanotube with the semiconductor characteristic.

Further, according to the present invention, there is provided an electronic apparatus using such an active electronic device which excels in high frequency operation.

What is claimed is:

1. A driving method of an electronic apparatus having an active electronic device including a carbon nanotube, a first electrode connected to one end of the carbon nanotube, a second electrode connected to the other end of the carbon nanotube, and a third electrode placed near the carbon nanotube to irradiate the carbon nanotube with electromagnetic waves, the method comprising:

causing the third electrode to output electromagnetic waves; and varying a frequency of the electromagnetic waves to control a conductance of the carbon nanotube, wherein the frequency includes at least a predetermined frequency so that the conductance of the carbon nanotube is increased.

2. The driving method of claim 1, wherein the frequency is about 1 GHz.

* * * * *